(12) United States Patent
Nguyen et al.

(10) Patent No.: US 6,828,217 B2
(45) Date of Patent: Dec. 7, 2004

(54) DICING PROCESS FOR GAAS/INP AND OTHER SEMICONDUCTOR MATERIALS

(75) Inventors: Hung C. Nguyen, Redondo Beach, CA (US); I-Ching T. Yang, Glendale, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/284,707

(22) Filed: Oct. 31, 2002

(65) Prior Publication Data

US 2004/0084755 A1 May 6, 2004

(51) Int. Cl.[7] .............................................. H01L 21/301
(52) U.S. Cl. ...................................... 438/462; 438/464
(58) Field of Search ................................ 438/462, 734, 438/464

(56) References Cited

U.S. PATENT DOCUMENTS

| | | | |
|---|---|---|---|
| 5,665,655 A | | 9/1997 | White |
| 5,904,546 A | * | 5/1999 | Wood et al. ................ 438/460 |
| 6,214,703 B1 | * | 4/2001 | Chen et al. ................ 438/462 |
| 6,271,102 B1 | | 8/2001 | Brouillette et al. |
| 6,291,317 B1 | | 9/2001 | Salatino et al. |
| 6,354,909 B1 | | 3/2002 | Boucher et al. |

* cited by examiner

*Primary Examiner*—Roy Potter
(74) *Attorney, Agent, or Firm*—Tarolli, Sundheim, Covell & Tummino L.L.P.

(57) ABSTRACT

A semiconductor wafer and a method for fabricating a semiconductor wafer having improved dicing lanes are provided. The dicing lanes include grooves formed by photolithography and etching processes. The wafer also includes a plating layer on a back side of the wafer to facilitate bonding of individual circuit chips to a suitable substrate and to effect efficient heat transfer between the chip and the substrate. Photolithography and etching processes are employed to etch horizontal and vertical lanes in the plating layer to facilitate breaking of the individual chips from the wafer. The horizontal and vertical lanes etched in the plating layer are coincident to the grooves etched in the substrate. The wafer can then be broken into individual circuit chips by applying stress to the back of the wafer, such that the wafer cleanly breaks along the horizontal and vertical dicing lanes and the etched grooves.

23 Claims, 6 Drawing Sheets

DICING PROCESS FOR GAAS/INP AND OTHER SEMICONDUCTOR MATERIALS

TECHNICAL FIELD

The present invention relates generally to fabrication of integrated circuits, and more particularly to an improved dicing process.

BACKGROUND OF THE INVENTION

In the manufacture of semiconductor devices, a plurality of integrated circuits are simultaneously prepared on a semiconductor wafer by conventional semiconductor fabrication techniques. Thus, a wafer can comprise multiple separate integrated circuits formed on a substantially planar surface area of the wafer according to conventional techniques, such as, photolithographic techniques, material deposition techniques, material etching techniques, and material doping techniques to form predetermined patterns and devices on or in a semiconductor body. A plurality of secondary devices such as contact pads, test monitor devices, and devices for measurement and alignment are also provided on the planar surface for the operation, testing and processing of the integrated circuits or other semiconductor devices.

A single integrated circuit is of relatively minute dimensions so that it is convenient to simultaneously form a plurality of circuits on a single wafer while marking the boundaries between the individual devices along substantially perpendicular axes referred to as dicing lines or lanes. Dicing lanes are formed spaced apart in two directions crossing at right angles on a wafer. Generally, the width of the dicing line is about 50–100 microns. As the dicing area is a region generally cut by a saw blade, an element of an integrated circuit is not formed in this region, but a test element for testing the function element or an alignment mark for mask alignment is often formed in the dicing area region.

Current dicing processes include sawing, as well as, scribing and breaking the wafer along the dicing lane. The sawing process is employed with a saw blade coupled to a spindle. The spindle rotates at a high speed to cut the wafer into individual chips. The scribe and break process, on the other hand, comprises dragging a diamond stylus along a surface of a wafer, which creates a stress for fractures to initiate. The wafer is then broken into individual chips. Both processes often cause chipping and the scribe and break process causes non-separation between dies, which results in yield loss. The chips occurring in the substrate propagate rapidly and tend to lead to failures that show up in testing. Currently, such problems are being addressed by providing dicing lanes that are large enough to minimize chipping from extending into active circuit lanes. However, by increasing the size of the dicing lanes, the number of integrated circuits that can be formed on the wafer is limited. Furthermore, the current processes are highly dependent on individual operator skills and are a generally time consuming process.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to a semiconductor wafer having improved dicing lanes. The dicing lanes include dry etching or chemically etched grooves formed in a substrate of the wafer. The dry etch or chemically etched grooves can be generally v-shaped. In one aspect of the invention, the dry etch or chemically etched grooves are generally about 0.3 to about 0.5 microns in depth and have a width of about 3 to about 5 microns. However, the depth and width of the grooves and the shape of the grooves can vary depending on the specific implementation. The wafer also includes a plating layer (e.g., gold layer) on a back side of the wafer after wafer is thinned to a specific value and to facilitate bonding of individual circuit chips to a suitable substrate and to effect efficient heat transfer between the chip and the substrate. The plating layer has horizontal and vertical lanes etched in the layer to facilitate breaking of the individual circuit chips from the wafer. The horizontal and vertical lanes etched in the plating layer are coincident to the v-shaped grooves etched in the substrate and/or dicing lanes of the substrate.

The present invention also relates to methods for an improved dicing process and for fabricating a semiconductor wafer with improved dicing lanes. Photolithography and etching processes are employed to etch grooves (e.g., v-shaped grooves) into dicing lanes on a front side of the wafer. A plating layer is then formed on a back side of the wafer and is subsequently etched to form lanes coincident with the grooves and/or dicing lanes on the front side of the wafer. The wafer can then be broken into individual circuit chips by applying stress to the back of the wafer, such that the wafer cleanly breaks along the lanes and v-shaped grooves.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

Figure 1:
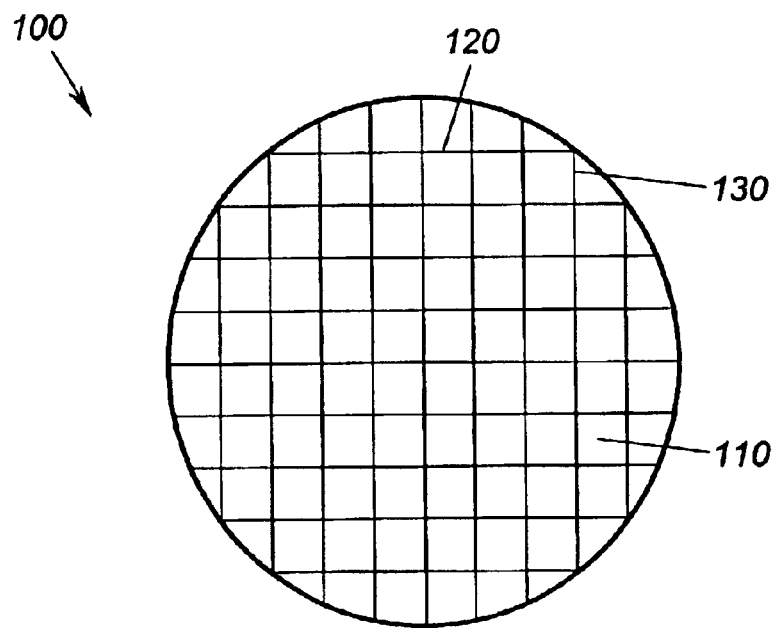
FIG. 1 illustrates a schematic top view of a wafer in accordance with an aspect of the present invention.

Various embodiments of the present invention will be described with reference to the accompanying drawings. It is to be noted that the same or similar reference numerals are applied to the same or similar parts and elements in some of the drawings, and the description of the same or similar parts and elements will be omitted or simplified. Generally and as it is conventional in the representation of semiconductor devices and packages, it will be appreciated that the various drawings are not drawn to scale from one figure to another nor inside a given figure, and in particular that the layer thicknesses are arbitrarily drawn for facilitating the reading of the drawings. In the following description, numerous specific details are set forth such as specific thickness values, etc. to provide a thorough understanding of the present invention. However, it will be obvious to those skilled in the art that the present invention may be practiced without such specific details.

The present invention provides for a dicing process, which employs a photolithography/dry etch or chemical etching process to create grooves within a plurality of dicing lanes on a front side of a wafer for fracture initiation. The structure of the present invention further facilitates employing smaller dicing lanes than conventional dicing lanes. Smaller dicing lanes can be utilized in the present invention as chipping problems seen with conventional dicing processes are mitigated. Accordingly, because the dicing lanes are smaller, more integrated circuit chips can be formed on the wafer. A wafer substrate can comprise silicon or other suitable semiconductor materials or compounds (e.g., group III–V semiconductor compounds, including gallium arsenide (GaAs), indium phosphide (InP), indium arsenide (InAs), gallium phosphide (GaP), indium gallium arsenide (InGaAs), and indium gallium arsenide phosphide (InGaAsP)). Furthermore, it is to be appreciated that the substrate need not be in the form of a wafer or a portion of a wafer.

FIG. 1 illustrates a semiconductor wafer 100 in accordance with an aspect of the present invention. The wafer 100 has a plurality of integrated circuit devices 110 formed thereon. The plurality of integrated circuit devices 110 are arranged in a plurality of rows and columns, which are separated by a plurality of dicing lanes, such as horizontal dicing lanes 120 and vertical dicing lanes 130. The plurality of integrated circuit devices 110 may or may not be identical to each other. For example, each of the plurality of integrated circuit devices 110 can be a data processor. Alternatively, the plurality of integrated circuit devices 110 can vary from each other in a manner that allows each die to be individually located on the semiconductor wafer. Die location is determined by an integrated circuit die's physical location on a wafer and can be described in a variety of ways. For instance, each integrated circuit die on a wafer is given a unique identifier, such as a sequential number or column and row coordinates that correspond to one particular integrated circuit die location on each wafer.

Figure 2:
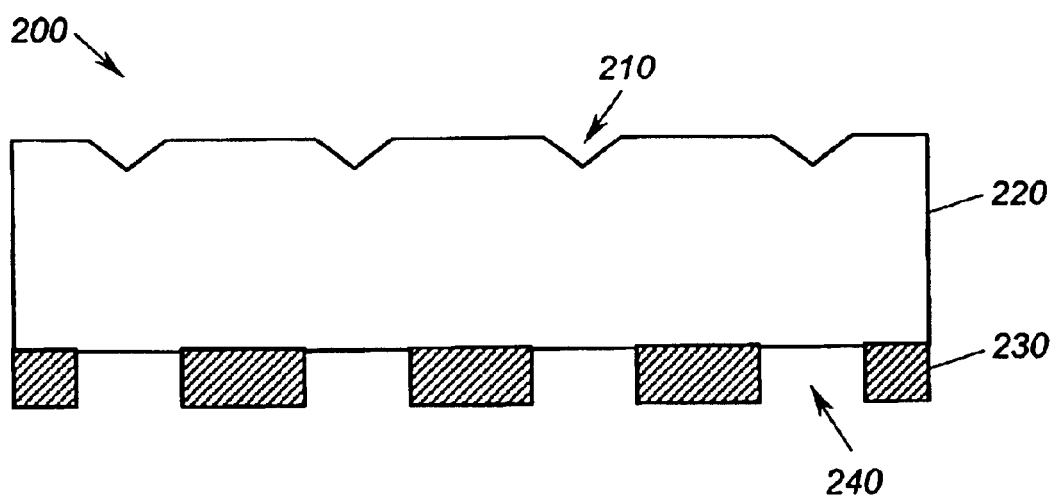
FIG. 2 illustrates a schematic cross-sectional view of a wafer having grooves in dicing lanes in accordance with an aspect of the present invention.

Turning now to FIG. 2, a cross-sectional view of a wafer 200 having a plurality of dicing lanes is depicted. The dicing lanes provide separation between active circuits and include v-shaped grooves 210 dry etched or chemically etched in a substrate 220 of the wafer 200. Alternatively, the v-shaped grooves 210 can form the dicing lanes. The v-shaped grooves 210 are generally about 0.3 to 0.5 microns in depth and have a width of about 3 to about 5 microns. However, the depth and width of the grooves 210 can vary depending on a particular implementation. It is to be appreciated that although v-shaped grooves are depicted throughout the figures, a variety of different shape grooves can be employed in accordance with the present invention. The wafer 200 also includes a plating layer 230 (e.g., gold layer) on a back side of the wafer 200 to facilitate bonding of individual circuit chips to a suitable substrate and to effect efficient heat transfer between the chip and the substrate. The plating layer 230 has lanes 240 etched in the layer 230 to facilitate breaking of the individual circuit chips from the wafer. The lanes 240 etched in the plating layer 230 can be horizontal and vertical lanes and are coincident to the v-shaped grooves 210 chemically etched in the substrate 220 and/or the dicing lanes of the substrate.

Figure 3:
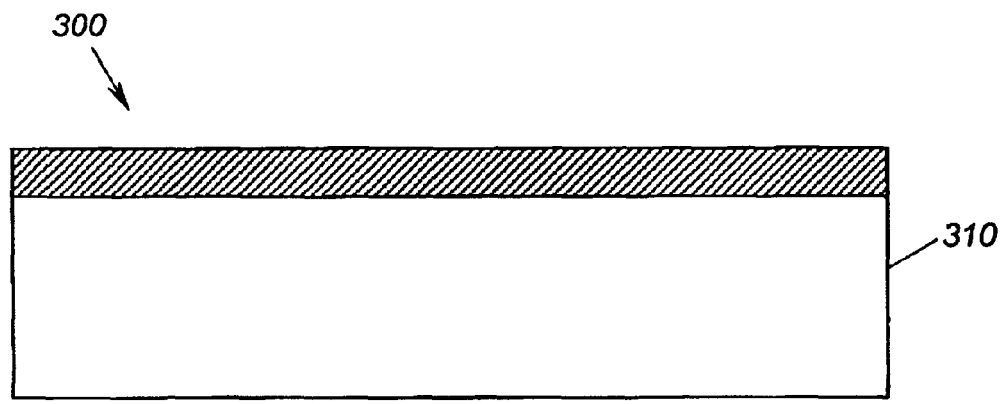
FIG. 3 illustrates a schematic cross-sectional view of a wafer in accordance with an aspect of the present invention.

Turning now to FIGS. 3–17, process blocks in connection with fabrication of the wafer in accordance with an aspect of the present invention are described. FIG. 3 illustrates a semiconductor wafer 300 in accordance with an aspect of the present invention. The wafer 300 comprises a substrate 310, which can be composed of any conventional semiconductor material including, but not limited to: Silicon (Si), Germanium (Ge), Silicon Germanium (SiGe), GaAs, InAs, InP and other group III–V semiconductor compounds. The substrate 310 may also be composed of a layered semiconductor such as Si/SiGe. Compound semiconductors such as GaAs and InP possess excellent properties such as high electron mobility being suitable for high frequency and high-speed devices. Thus, devices employing group III–V compounds can operate at higher voltages, power, and switching frequencies, than devices employing standard silicon wafers.

Figure 4:
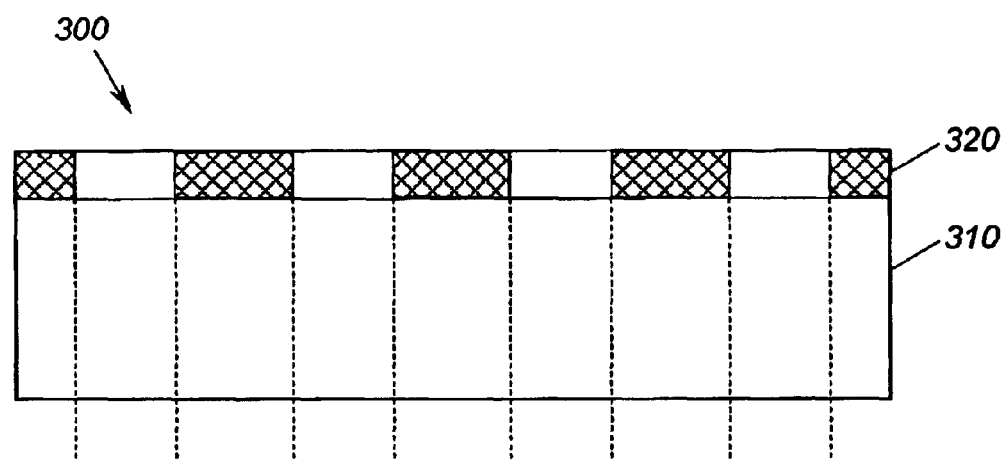
FIG. 4 illustrates a schematic cross-sectional view of the wafer of FIG. 3 with a layer of photoresist formed thereon in accordance with an aspect of the present invention.

In FIG. 4, the semiconductor substrate 310 has a layer of photoresist 320 formed thereon. A resist solution can be applied to the substrate 310 by any conventional method, including dipping, spraying, and spin coating. When spin coating, for example, the resist solution can be adjusted as to the percentage of solids content in order to provide coating of the desired thickness given the type of spinning equipment utilized and the amount of time allowed for the spinning process. The thickness of the photoresist layer 320 may vary depending on the amount of liquid photoresist composition that is applied and the spin speed selected, but typically the thickness may range from about 500 Å to about 50,000 Å. The amount of photoresist composition applied can vary from about 1 ml to about 10 ml, depending on the size of the substrate 310.

After the resist composition solution is coated onto the substrate 310, the substrate 310 is temperature treated at approximately 20° Celsius to 200° Celsius. The temperature treatment is performed for reducing and controlling a concentration of residual solvents in the photoresist, while not causing substantial thermal degradation of the photosensitizer. Generally, it is desired to minimize the concentration of solvents and thus, the temperature treatment is conducted until substantially all of the solvents have evaporated and a thin coating of photoresist composition, on the order of about a micron in thickness, remains on the substrate 310. For example, the substrate 310 and photoresist material are heated in a range of about 90° Celsius to about 100° Celsius until the rate of change of solvent removal becomes relatively insignificant. The temperature and time selection depends on the resist properties desired by a user as well as equipment used and commercially desired coating times. Commercially acceptable treatment times for hot plate treatment are those up to about 3 minutes. For example, a 30 second treatment at 90° Celsius can be employed. Treatment times increase to about 20 to about 40 minutes when conducted in a convection oven at such temperatures.

Figure 5:
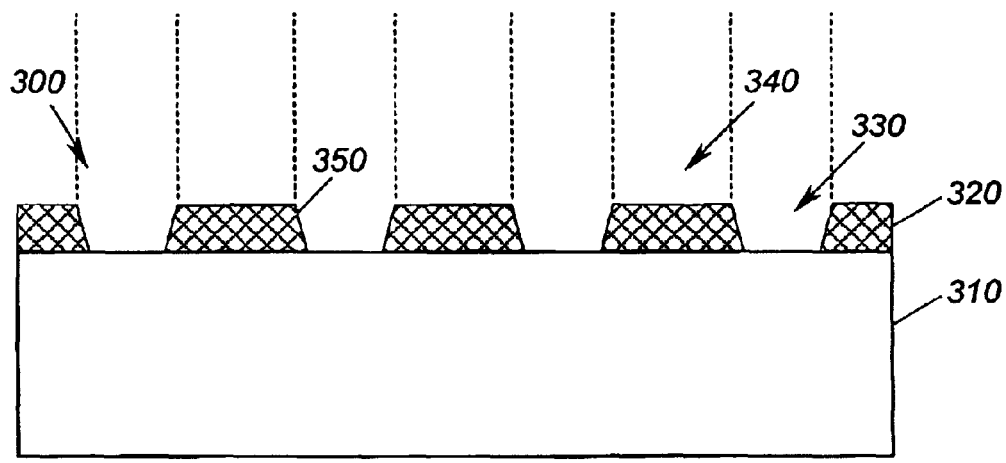
FIG. 5 illustrates a schematic cross-sectional view of the wafer of FIG. 4 after the photoresist layer has been patterned in accordance with an aspect of the present invention.

FIG. 5 depicts the substrate 310 after the photoresist layer 320 has been patterned. The photoresist layer 320 is patterned by employing a photolithography process. The photoresist layer 320 generally comprises a conventional light sensitive material, which changes properties when exposed to light. For example, the photoresist layer 320 may be a polyvinylphenol (PVP). The photoresist layer 320 is selectively exposed to light such as X-ray or ultraviolet light by making use of a mask (not shown), which blocks transmission of light to photoresist layer 320 at selective locations. The pattern of the mask matches a pattern that ultimately is to be formed in patterned layer 320. The properties of the exposed surface area of photoresist layer 320 are changed by the exposure. For example, the exposed surface area can be made such that it is insoluble or soluble to certain chemical solvents, which are used as developers. Accordingly, by applying developer to the exposed photoresist layer 320, the surface area thereof that has been exposed to the light (e.g., irradiated) or not exposed to the light (e.g., non-irradiated) is removed by the developer to leave holes 330 in photoresist layer 320 which correspond to the pattern of the mask.

As illustrated in FIG. 5, the holes 330 isolate a plurality of islands 340 which correspond to the mask. In other words, the pattern of the mask is transferred to photoresist layer 320 during development. The pattern of the photoresist layer 320, which now has the form of islands 340, can now be employed as a mask for etching the substrate 310. The photoresist layer 320 is substantially etch resistant such that it does not dissolve in chemical etching solutions or during a dry etch process. Accordingly, the areas of the substrate 310 which are covered by polymerized photoresist islands 340 are also not dissolved in an etching solution or by an etching process. The exposed areas of the substrate 310 can be removed by etching to create openings or trenches between features to transfer a desired pattern to the substrate 310.

A conventional photoresist layer, as patterned by the photolithography process, generally has vertical sidewalls. Thus, when the photoresist pattern is utilized as an etch mask in a subsequent etch step, the shape of the holes in the photoresist pattern is transferred to the underneath etched layer, which, in turn, creates holes on the underneath etched layer having vertical sidewalls. Therefore, to create v-shaped grooves in the substrate 310, heat is applied to the photoresist layer 320 to shape the photoresist sidewalls 350. The heat applied to the photoresist layer 320 is applied at a temperature over a softening point of the photoresist material so as to occur softening of the highly polymerized photoresist layer 320 and reduce its viscosity and facilitate flow. The photoresist layer 320 is heated and flowed until the sidewalls 350 are suitably sloped to form v-shaped grooves in the substrate. For example, the heat can be applied at about 120° Celsius to about 180° Celsius. The heating is also operable to harden the photoresist layer 320.

Figure 6:
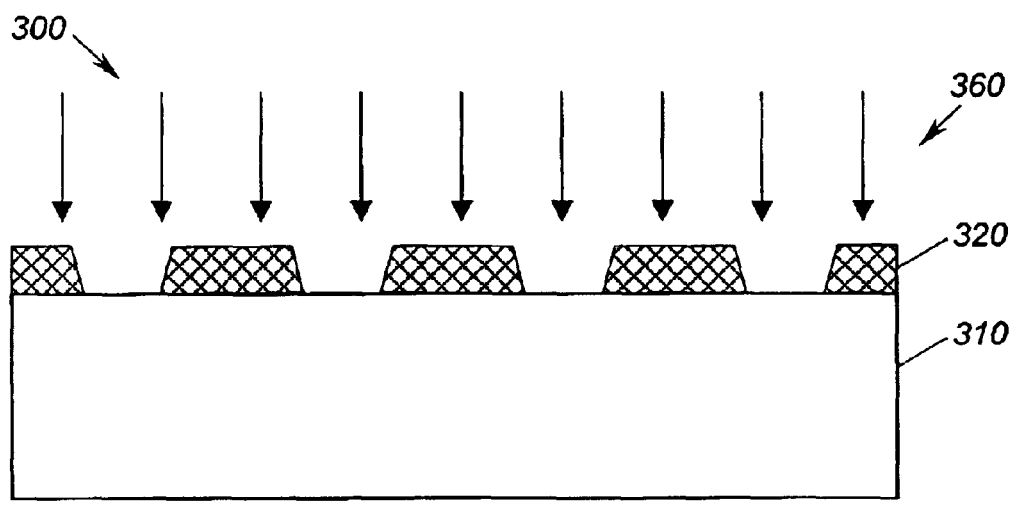
FIG. 6 illustrates a schematic cross-sectional view of the wafer of FIG. 5 undergoing an etching process in accordance with an aspect of the present invention.

Turning now to FIG. 6, the wafer 300 undergoes a chemical etching process 360, which employs the patterned photoresist layer 320 as a mask. The chemical etching process 360 can be a conventional dry etching process such as RIE, ion-beam etching, plasma etching or any other suitable etching process. A combination of the aforementioned dry etching processes may also be used in providing the grooves in the substrate material 310. It is to be appreciated that a wet etching process can also be employed to etch the substrate 310. Wet etching is usually accomplished with acid etchants, such as hydrofluoric acid. However, wet etching is generally not suitable for etching lines and spaces of less than about 3 microns as it is an isotropic process. That is, the etching also proceeds laterally through the substrate 310, thereby undercutting the photoresist 320. This may cause the polymer photoresist 320 to swell or lift off. Accordingly, a dry etching process, such as plasma etching, is preferred because it can be performed anisotropically, leaving sharper edge profiles. Plasma etching can be accomplished with oxygen-containing etch gas.

Figure 7:
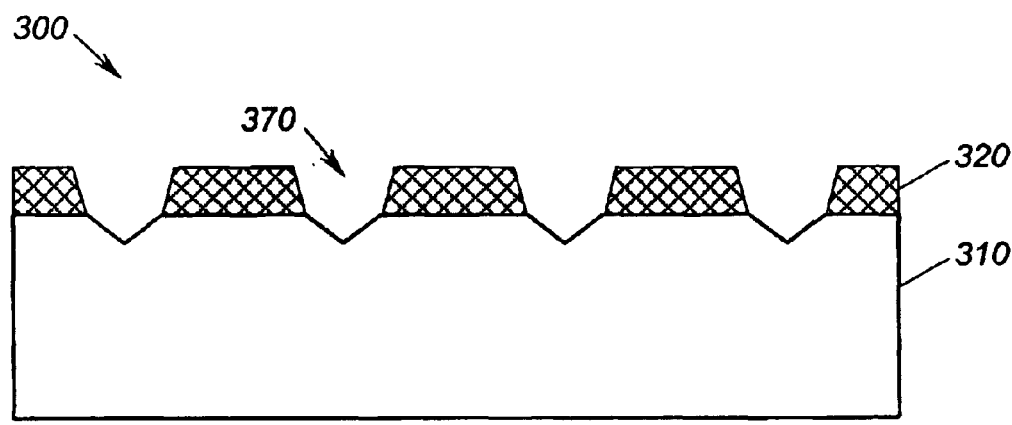
FIG. 7 illustrates a schematic cross-sectional view of the wafer of FIG. 6 after the etching process is substantially complete in accordance with an aspect of the present invention.
Figure 8:
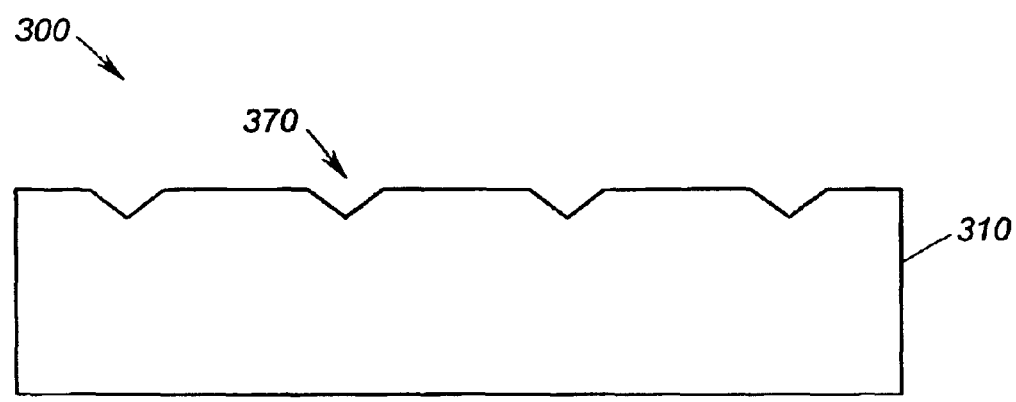
FIG. 8 illustrates a schematic cross-sectional view of the wafer of FIG. 7 after the photoresist layer has been substantially removed in accordance with an aspect of the present invention.

FIG. 7 depicts the wafer 300 after the etching process 360 has been substantially completed. The etching process 360 transferred the shape of the patterned photoresist layer 320 onto the substrate 310. Thus, as the photoresist layer 320 has sloped sidewalls, grooves 370 etched in the substrate 310 are substantially v-shaped. The v-shaped grooves 370 are generally about 0.3 to about 0.5 microns in depth and have a width of about 3 to about 5 microns. However, the depth and width of the grooves 370 can vary depending on preferences. It is to be appreciated that although v-shaped grooves are depicted throughout the figures, any shape groove can be used. The patterned photoresist layer 320 is then removed by utilizing chemicals or plasma, as in conventional photoresist stripping techniques (e.g., ashing in an $O_2$ plasma). After the photoresist layer 320 has been substantially removed, the substrate 310 is left with a plurality of the v-shaped grooves 370 in both x and y directional dicing lanes, as illustrated in FIG. 8.

Figure 9:
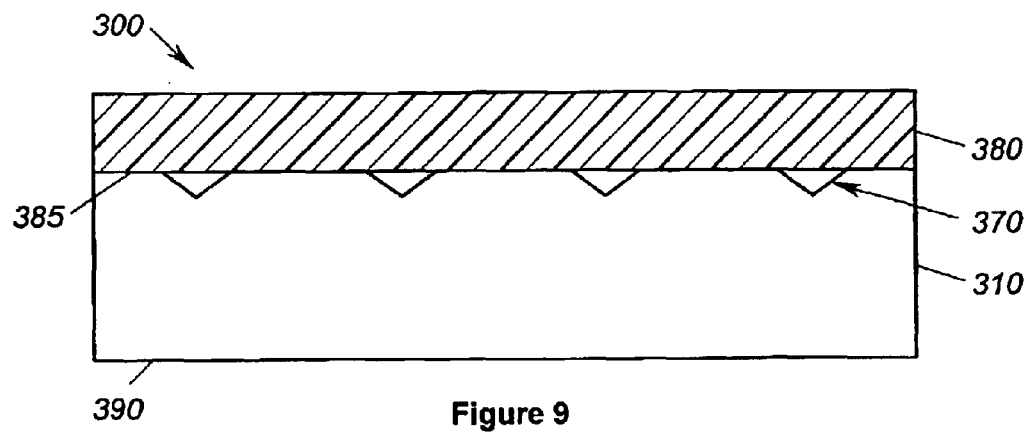
FIG. 9 illustrates a schematic cross-sectional view of the wafer of FIG. 8 with a thermoplastic layer formed thereon in accordance with an aspect of the present invention.

FIG. 9 illustrates the substrate 310 having a protective layer 380 formed thereon. After a front side 385 of the substrate 310 has been etched with the v-shaped grooves 370, a back side process is performed. Since integrated circuits (not shown) and the v-shaped grooves 370 are currently located on the front side 385 of the substrate 310, these patterns or layers can be damaged or contaminated by particles by putting the wafer 300 down on an equipment holder during subsequent back side processing. Accordingly, the front surface 385 of the substrate 310 is substantially coated with temporary protective layer 380, such as a layer of thermoplastic material. The thermoplastic layer 380 facilitates protection of the front surface 385 while a back side 390 of the wafer 300 undergoes processing. For example, polyimide resin, epoxy resin, urethane resin, polyether imide resin, silicon resin, mixture of these resins, etc. can be utilized as the protective coating 380.

The thermoplastic layer 380 is further employed to couple the wafer 300 to support and improve mechanical stability of the wafer 300 during the subsequent processing operations. It is to be appreciated that the plate can be of any suitable material, for example, quartz or sapphire. However, sapphire is preferred because it is inert to chemical etching.

Figure 10:
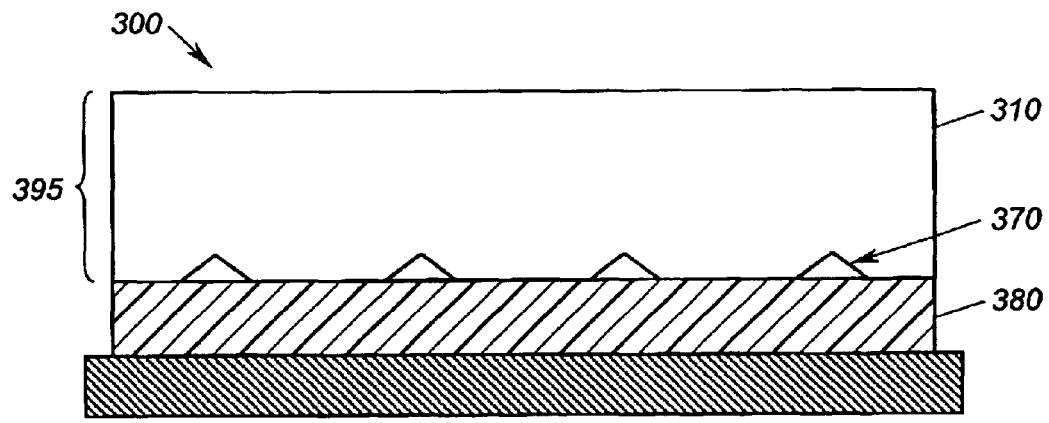
FIG. 10 illustrates a schematic cross-sectional view of the wafer of FIG. 9 after the wafer has been inverted in accordance with an aspect of the present invention.

The wafer 300 is then inverted, as shown in FIG. 10 and a thickness 395 of the substrate 310 is reduced by lapping or grinding the back surface 390 of the wafer 300. Grinding employs a grinding tool, such as a diamond grindstone, for grinding the rear surface 390 of the semiconductor wafer 300; while lapping employs a lapping tool, such as a bob, with abrasive material for lapping the rear surface 390 of a semiconductor wafer 300 to a desired thickness. The resultant structure can have a total thickness (measured between front surface 385 and back surface 390) of about 1 to about 15 mils. Alternatively, other thinning techniques such as wet etching, vacuum plasma etching, and an atmospheric downstream plasma (ADP) etching system can be employed. Etching is achieved by utilizing etchants, such as a mixture of fluoric acid and nitric acid, while the semiconductor wafer 300 is rotated at a high speed.

Figure 11:
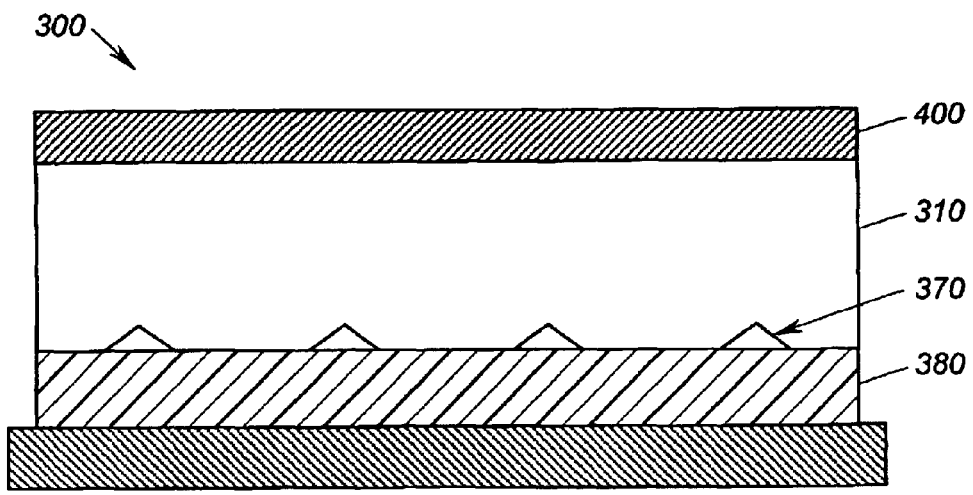
FIG. 11 illustrates a schematic cross-sectional view of the wafer of FIG. 10 with a plating layer formed thereon in accordance with an aspect of the present invention.
Figure 12:
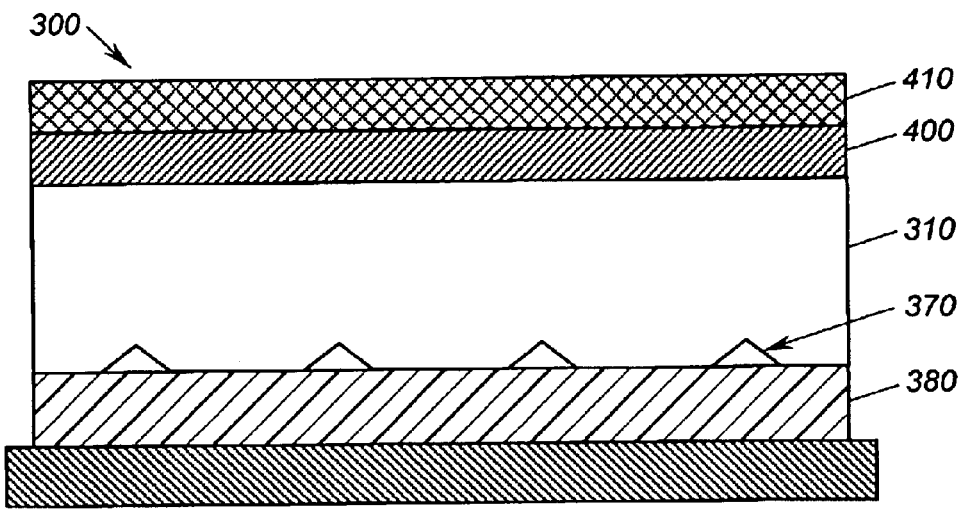
FIG. 12 illustrates a schematic cross-sectional view of the wafer of FIG. 11 with a layer of photoresist formed thereon in accordance with an aspect of the present invention.
Figure 13:
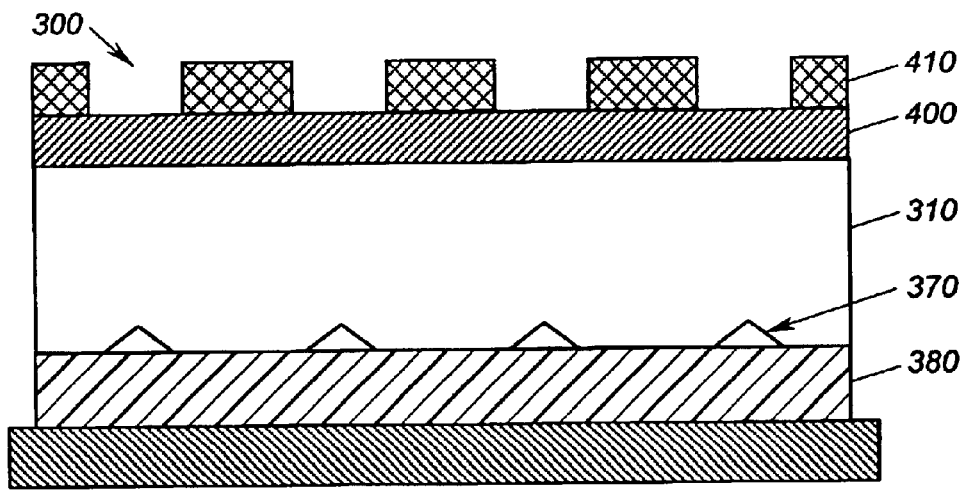
FIG. 13 illustrates a schematic cross-sectional view of the wafer of FIG. 12 after the photoresist layer has been patterned in accordance with an aspect of the present invention.
Figure 14:
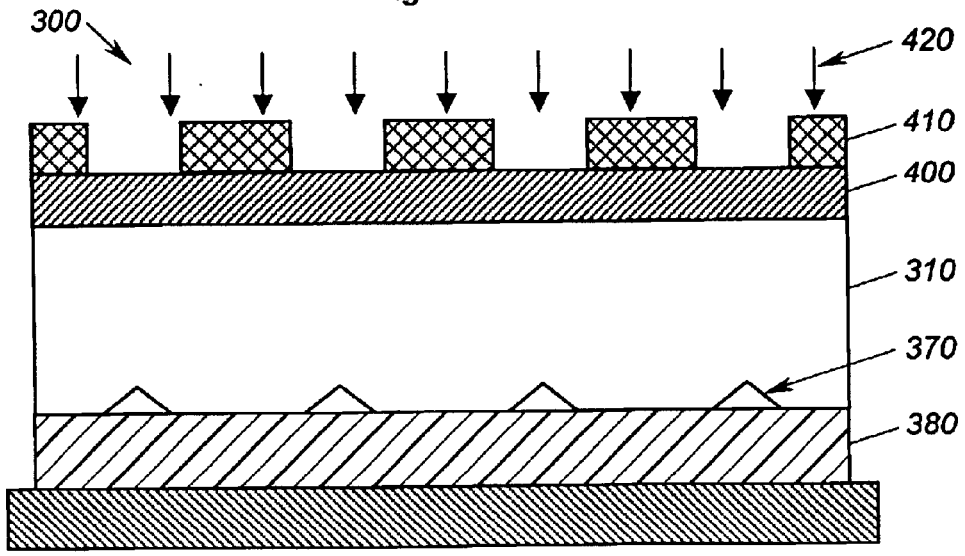
FIG. 14 illustrates a schematic cross-sectional view of the wafer of FIG. 13 undergoing an etching process in accordance with an aspect of the present invention.
Figure 15:
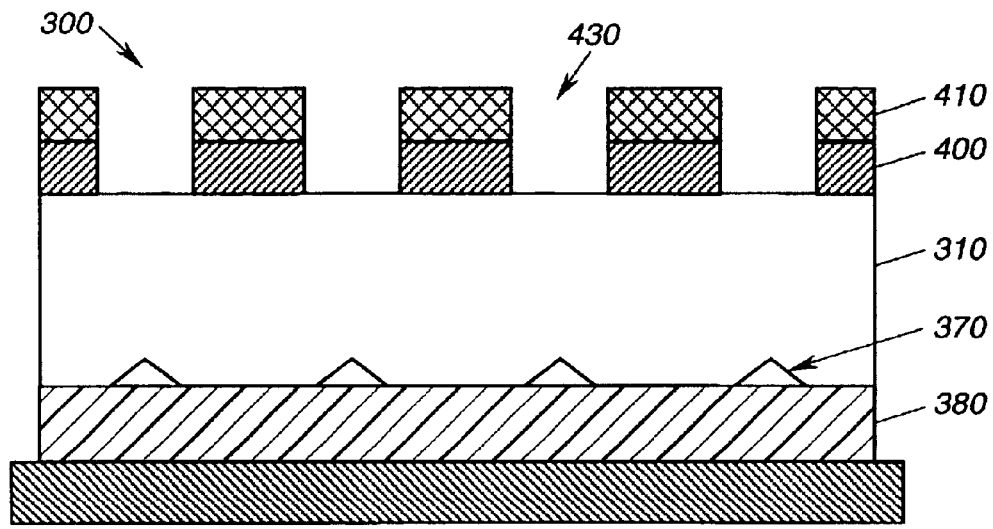
FIG. 15 illustrates a schematic cross-sectional view of the wafer of FIG. 14 after the etching process is substantially complete in accordance with an aspect of the present invention.
Figure 16:
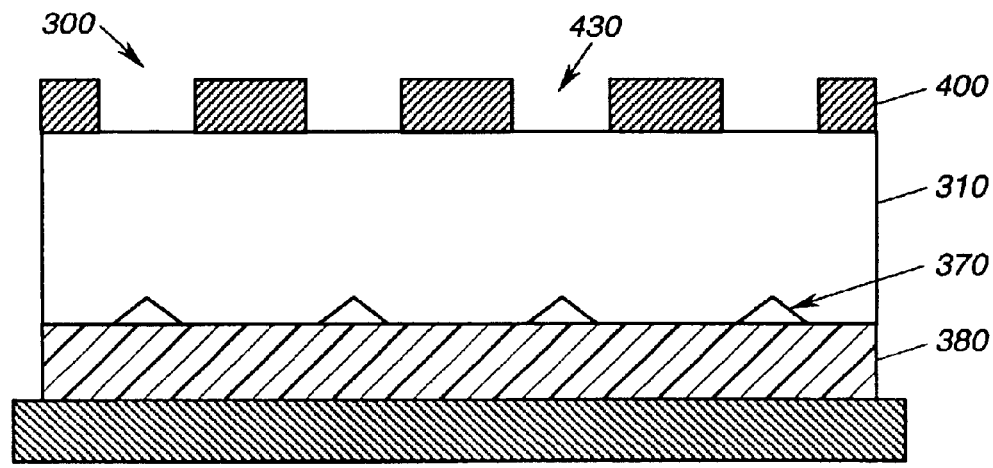
FIG. 16 illustrates a schematic cross-sectional view of the wafer of FIG. 15 after the photoresist layer has been substantially removed in accordance with an aspect of the present invention.

After the lapping or grinding process, a plating layer 400 (e.g., gold layer) is provided substantially across the back side 390 of the wafer 300, as illustrated in FIG. 11. The plating layer 400 is employed to facilitate bonding of individual circuit chips to a suitable substrate, or printed wiring board, and to effect an efficient heat transfer between the chip and the substrate, or printed wiring board. The plating layer 400 is further employed to increase mechanical strength of the wafer 300. The bond between the substrate 310 and the plating layer 400 can be formed by alloying the plating material and substrate material at a temperature in the range of 100° Celsius to 200° Celsius. This is achieved by evaporating or vacuum depositing the layer of plating 400 onto the back side 390 of the wafer 300. Then, alloying the plating material 400 to the substrate 310 to form a eutectic bond at approximately 380° Celsius, thereby forming a strong intimate bond between the plating layer 400 and the wafer 300.

Turning now to FIGS. 12–16, a photoresist layer 410 is deposited (FIG. 12) on the plating layer 400 of the thinned substrate 310. The photoresist layer 410 is patterned (FIG. 13) and undergoes an etching process 420 (FIG. 14) in a manner similar to that described above to form openings 430 in the plating layer 400. The openings 430 (FIG. 15) in the plating layer 400 are formed such that they are coincident to the dicing lanes (not shown) and/or the v-shaped grooves 370 formed within the dicing lanes on the front side 385 of the wafer 300. As shown, the openings 430 in the plating layer 400 have vertical sidewalls as the photoresist 410 has been patterned with vertical sidewalls. Thus, depending on the shape of the patterned photoresist 410, the openings could be a variety of different shapes. The photoresist layer 410 is removed (FIG. 16) by conventional photoresist stripping techniques.

Figure 17:
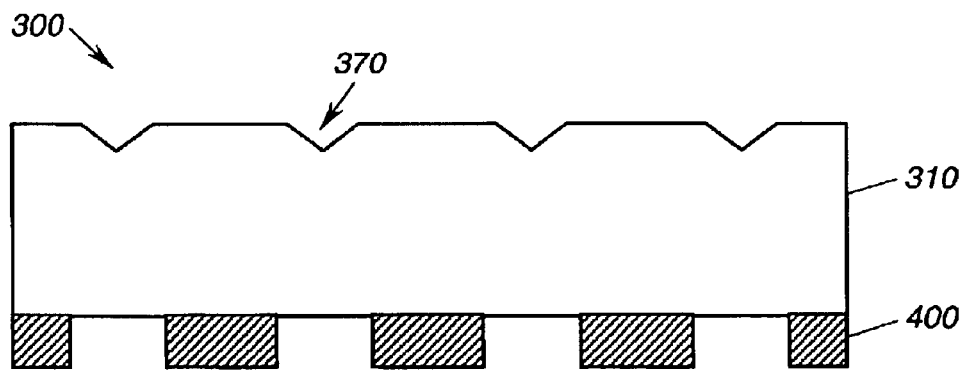
FIG. 17 illustrates a schematic cross-sectional view of the wafer of FIG. 16 after the wafer has been inverted and the thermoplastic layer has been substantially removed in accordance with an aspect of the present invention.

Upon completion of the back side processing of the semiconductor wafer 300, the wafer 300 is placed in a suitable solvent to dissolve the protective thermoplastic layer 380 and to permit removal of wafer 300 from the sapphire plate 382. The solvent utilized dissolves the thermoplastic layer 380, but not the sapphire plate. Thus, the sapphire plate 382 can be reused in other semiconductor processing operations. The resulting semiconductor wafer 300 is illustrated in FIG. 17. Such a structure facilitates a clean break of the wafer 300 into individual chips.

To break the wafer 300 into individual circuit chips, stress is applied to the back of the wafer 300, such that the wafer 300 cleanly breaks along the horizontal and vertical dicing lanes and v-shaped grooves 370. The stress can be applied to the wafer 300 manually or by machine. If necessary, sides of the circuit chips can be polished after breaking. The individual circuit chips are then ready to be bonded, face up, to a suitably prepared and patterned substrate, such as a printed wiring board.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating a semiconductor wafer, comprising:
   providing a wafer having a plurality of integrated circuits on a front side of the wafer;
   applying a photoresist layer substantially over the front side of the wafer;
   employing a first photolithography process to pattern the photoresist layer to provide a groove pattern in dicing lanes of the wafer;
   chemically etching v-shaped grooves into the dicing lanes of the wafer; and
   breaking the wafer along the plurality of grooves into a plurality of integrated circuit chips by applying stress to a back side of the wafer.

2. The method of claim 1, further comprising heating the patterned photoresist layer such that the patterned photoresist layer flows to form sloped sidewalls.

3. The method of claim 2, the heating the patterned photoresist layer in a range of about 120° Celsius to about 180° Celsius.

4. The method of claim 1, the etching the grooves into the dicing lanes of the wafer employing a dry etching process.

5. The method of claim 4, the dry etching process being at least one of reactive ion etching (RIE), ion-beam, and plasma etching.

6. The method of claim 1, further comprising providing a protective thermoplastic layer substantially across the front side of the wafer and inverting the wafer to perform back side processing.

7. The method of claim 1, further comprising reducing a back side of the wafer to a thickness of about 2 mils to about 4 mils.

8. The method of claim 1, further comprising providing a plating layer substantially across a back side of the wafer for facilitating bonding of the integrated circuits to a substrate.

9. The method of claim 8, the plating layer being a gold layer.

10. The method of claim 8, further comprising forming a patterned photoresist layer substantially across the plating layer.

11. The method of claim 10, further comprising, employing the patterned photoresist layer as a mask to etch a plurality of etched lanes in the plating layer, the etched lanes being coincident to at least one of the groove pattern and the dicing lanes.

12. A dicing process, comprising:
chemically etching a plurality of grooves into a front side of a semiconductor wafer;
forming a plurality of lanes on a back side of the semiconductor wafer, the plurality of lanes being coincident with the plurality of grooves etched on the front side of the wafer; and
breaking the wafer along the plurality of grooves into a plurality of integrated circuit chips by applying stress to a back side of the wafer.

13. The dicing process of claim 12, the forming a plurality of lanes on a back side of the semiconductor wafer comprising etching a plurality of lanes within a gold layer on the back side of the wafer.

14. The dicing process of claim 12, the semiconductor wafer comprising at least one of Gallium Arsenide (GaAs), Indium Phosphide (InP), Indium Arsenide (InAs), Silicon Germanium (SiGe), Germanium (Ge), and Silicon (Si).

15. The dicing process of claim 12, the plurality of grooves etched in a substantially v-shaped pattern.

16. A method for fabricating a semiconductor wafer, comprising:
providing a wafer having a plurality of integrated circuits on a front side of the wafer;
applying a photoresist layer substantially over the front side of the wafer;
employing a first photolithography process to pattern the photoresist layer to provide a groove pattern in dicing lanes of the wafer;
chemically etching grooves into the dicing lanes of the wafer;
providing a plating layer substantially across a back side of the wafer for facilitating bonding of the integrated circuits to a substrate; and
breaking the wafer along the plurality of grooves into a plurality of integrated circuit chips by applying stress to a back side of the wafer.

17. The method of claim 16, further comprising heating the patterned photoresist layer such that the patterned photoresist layer flows to form sloped sidewalls.

18. The method of claim 16, the heating the patterned photoresist layer in a range of about 120° Celsius to about 180° Celsius.

19. The method of claim 16, the etching the grooves into the dicing lanes of the wafer comprising etching v-shaped grooves.

20. The method of claim 16, further comprising providing a protective thermoplastic layer substantially across the front side of the wafer and inverting the wafer to perform back side processing.

21. The method of claim 16, further comprising reducing a back side of the wafer to a thickness of about 2 mils to about 4 mils.

22. The method of claim 16, the plating layer being a gold layer.

23. The method of claim 16, further comprising forming a patterned photoresist layer substantially across the plating layer, and employing the patterned photoresist layer as a mask to etch a plurality of etched lanes in the plating layer, the etched lanes being coincident to at least one of the groove pattern and the dicing lanes.

* * * * *